United States Patent

Hunt et al.

[11] Patent Number: 6,132,653
[45] Date of Patent: Oct. 17, 2000

[54] CHEMICAL VAPOR DEPOSITION AND POWDER FORMATION USING THERMAL SPRAY WITH NEAR SUPERCRITICAL AND SUPERCRITICAL FLUID SOLUTIONS

[75] Inventors: Andrew T. Hunt; Helmut G. Hornis, both of Atlanta, Ga.

[73] Assignee: Microcoating Technologies, Chamblee, Ga.

[21] Appl. No.: 09/293,030

[22] Filed: Apr. 16, 1999

Related U.S. Application Data

[62] Division of application No. 08/691,853, Aug. 2, 1996, Pat. No. 5,997,956.
[60] Provisional application No. 60/002,084, Aug. 4, 1995.
[51] Int. Cl.[7] .................................................. B29B 9/00
[52] U.S. Cl. ...................... 264/5; 264/7; 264/12; 427/450; 427/576; 427/577; 427/249.1
[58] Field of Search .............................. 423/335; 264/5, 264/7, 12; 427/450, 576, 577, 249.1, 249.7, 250

[56] References Cited

U.S. PATENT DOCUMENTS

| | | | |
|---|---|---|---|
| H1839 | 2/2000 | Combes et al. | 264/12 |
| 4,582,731 | 4/1986 | Smith | 427/421 |
| 4,734,227 | 3/1988 | Smith | 264/13 |
| 4,734,451 | 3/1988 | Smith | 524/493 |
| 4,970,093 | 11/1990 | Sievers et al. | 427/575 |
| 5,032,568 | 7/1991 | Lau et al. | 505/477 |
| 5,213,851 | 5/1993 | Snyder et al. | 427/576 |
| 5,716,558 | 2/1998 | Nielsen et al. | 264/13 |
| 5,833,891 | 11/1998 | Subramaniam et al. | 264/7 |
| 5,840,774 | 11/1998 | Ehrlich et al. | 521/61 |
| 5,910,298 | 6/1999 | Yamasaki et al. | 423/592 |

*Primary Examiner*—Timothy Meeks
*Assistant Examiner*—Bret Chen
*Attorney, Agent, or Firm*—Edward J. Kelly; Foley, Hoag & Eliot LLP

[57] ABSTRACT

A method for chemical vapor deposition using a very fine atomization or vaporization of a reagent containing liquid or liquid-like fluid near its supercritical temperature, where the resulting atomized or vaporized solution is entered into a flame or a plasma torch, and a powder is formed or a coating is deposited onto a substrate. The combustion flame can be stable from 10 torr to multiple atmospheres, and provides the energetic environment in which the reagent contained within the fluid can be reacted to form the desired powder or coating material on a substrate. The plasma torch likewise produces the required energy environment, but, unlike the flame, no oxidizer is needed so materials stable in only very low oxygen partial pressures can be formed. Using either the plasma torch or the combustion plasma, coatings can be deposited and powders formed in the open atmosphere without the necessity of a reaction chamber, but a chamber may be used for various reasons including process separation from the environment and pressure regulation.

1 Claim, 3 Drawing Sheets

CHEMICAL VAPOR DEPOSITION AND POWDER FORMATION USING THERMAL SPRAY WITH NEAR SUPERCRITICAL AND SUPERCRITICAL FLUID SOLUTIONS

BACKGROUND OF THE INVENTION

I. Related Cases

This application is a division of application Ser. No. 08/691,853, filed Aug. 2, 1996, now U.S. Pat. No. 5,997,956, which is a continuation-in-part of U.S. Provisional Application Ser. No. 60/002,084, filed Aug. 4, 1995, the contents of which are hereby incorporated in their entirety by this reference.

II. Field of the Invention

This invention relates to methods of powder formation and thin film deposition from reagents contained in liquid or liquid-like fluid solutions, whereby the fluid solution, near its supercritical point temperature, is released into a region of lower pressure causing a superior, very fine atomization or vaporization of the solution. Gasses are entrained or fed into the dispersed solution and rapidly flow into a flame or plasma torch. The reagents react and form either: 1) powders which are collected; or 2) a coating from the vapor phase onto a substrate positioned in the resulting gases and vapors. Release of the near supercritical point temperature fluid causes dispersion and expansion resulting in a very fine nebulization of the solution, which yields improved powder and film quality, deposition rates and increases the number of possible usable precursors.

III. Background of the Invention

Chemical vapor processing has been used extensively for the production of powders and coatings. Chemical vapor deposition ("CVD") is the term used when coatings onto a substrate are formed. CVD production of coatings is widespread. Many of these coating are only nanometers thick and smooth to less than 5% percent of coating thickness. Reaction and agglomeration of the reacted vapor material in the gas stream forms powders which can be commercially useful. In fact, nanopowders are required in the formation of nanomaterials which have different properties from those of bulk materials. These materials' properties can be tailored by controlling the cluster size of the nanopowder. Similarly, coatings of less than 50 nm can have properties which are different from thicker films, and the properties change further as the coating thins.

It is desirable to form such powders and coatings at low production and capitalization costs and with simple production processes. However, for many materials there is a very limited selection of available precursors which can be vaporized and used for traditional CVD. Being able to form coatings in the open atmosphere tremendously eases substrate handling and flow through the coating process. In addition to thin films low cost quality thick coatings and bulk materials are also desirable.

Combustion chemical vapor deposition ("CCVD"), a recently invented CVD technique, allows for open atmosphere deposition of thin films. The CCVD process offers several advantages over other thin-film technologies, including traditional CVD. The key advantage of CCVD is its ability to deposit films in the open atmosphere without any costly furnace, vacuum, or reaction chamber. As a result, the initial system capitalization requirement can be reduced up to 90% compared to a vacuum based system. Instead of a specialized environment, which is required by other technologies, a combustion flame provides the necessary environment for the deposition of elemental constituents from solution, vapor, or gas sources. The precursors are generally dissolved in a solvent that also acts as the combustible fuel. Depositions can be performed at atmospheric pressure and temperature within an exhaust hood, outdoors, or within a chamber for control of the surrounding gasses or pressure.

Since CCVD generally uses solutions, a significant advantage of this technology is that it allows rapid and simple changes in dopants and stoichiometries which eases deposition of complex films. In contrast to conventional CVD, where the precursor vapor pressure is a concern which dictates expensive high vapor pressure precursors, the CCVD technique generally uses inexpensive, soluble precursors. In addition, precursor vapor pressures do not play a role in CCVD because the dissolution process provides the energy for the creation of the necessary ionic constituents. In general, the precursor materials used for traditional CVD depositions are between 10 and 1000 times more expensive than those which can be used in CCVD processing. By adjusting solution concentrations and constituents, a wide range of stoichiometries can be deposited quickly and easily. Additionally, the CCVD process allows both chemical composition and physical structure of the deposited film to be tailored to the requirements of the specific application.

Unlike CVD, the CCVD process is not confined to an expensive, inflexible, low-pressure reaction chamber. Therefore, the deposition flame, or bank of flames, can be moved across the substrate to easily coat large and/or complex surface areas. Because the CCVD process is not limited to specialized environments, the user can continuously feed materials into the coating area without disruption, thereby permitting batch processing. Moreover, the user can limit deposition to specific areas of a substrate by simply controlling the dwell time of the flame(s) on those areas. Finally, the CCVD technology generally uses halogen free chemical precursors having significantly reduced negative environmental impact compared to conventional CVD, resulting in more benign by-products.

Numerous materials have been deposited via CCVD technology with the combustion of a premixed precursor solution as the sole heat source. This inexpensive and flexible film deposition technique permits broader use of thin film technology. The CCVD process has much of the same flexibility as thermal spraying, yet creates quality, conformal films like those associated with CVD. Traditional CVD often requires months of effort to successfully deposit a material. With CCVD processing, a desired phase can be deposited in a few days and at a fraction of the cost of traditional CVD.

By providing these coating capabilities inexpensively, the CCVD process can broaden the commercial opportunity for thin films, including use in tribological, thermal protective, wear, space environment protective, optic, electronic, structural and chemical resistant applications. Thus, government and commercial users can benefit from the advantages of thin films over thick films, including their high adhesion to the substrate, controlled microstructure, greater flexibility, reduced raw material consumption and reduced effect on the operating characteristics and/or dimensions of the coated system.

Ichinose, H., Shiwa, Y., and Nagano, M., Synthesis of $BaTiO_3/LaNiO_3$ and $PbTiO_3/LaNiO_3$ Thin Films by Spray Combustion Flame Technique, Jpn. J. Appl. Phys., Vol. 33, 1, 10 p. 5903–6 (1994) and Ichinose, H., Shiwa, Y., and Nagano, M., Deposition of $LaMO_3$ (M=Ni, Co, Cr, Al)—

Oriented Films by Spray Combustion Flame Technique, Jpn. J. Appl. Phys., Vol. 33, 1, 10 p. 5907–10 (1994) used CCVD processing, which they termed spray combustion flame technique, by ultrasonically atomizing a precursor containing solution, and then feeding the resulting nebulized solution suspended in argon carrier gas into a propane combustion flame. However, these atomization techniques cannot reach the highly desirable submicron capabilities which are important to obtaining improved coating and powder formation.

U.S. Pat. No. 4,582,731 (the "'731 patent") discloses the use of a supercritical fluid molecular spray for the deposition of films. However, the '731 patent is for physical vapor deposition (PVD), which differs from the independently recognized field of CVD by having no chemical reagents and normally being operated at high vacuum. Additionally, no flame or plasma torch is used in this method, and only supercritical fluid solutions are considered. Chemical reagents are beneficial because of there physical properties, including higher solubility. The flame and plasma torch enable coatings in the open atmosphere with no additional heat source. The '731 deposition material, however, does not start from a reagent, and thus will not react at supercritical conditions.

U.S. Pat. No. 4,970,093 (the "'093 patent") discloses the use of supercritical fluids and CVD for the deposition of films. Work related to the '083 patent is described in B. M. Hybertson, B. N. Hansen, R. M. Barkley and R. E. Sievers, Supercritical Fluid Transport-Chemical Deposition of Films, Chem. Mater., 4, 1992, p. 749–752 and Hybertson et al and B. N. Hansen, B. M. Hybertson, R. M. Barkley and R. E. Sievers, Deposition of Palladium Films by a Novel Supercritical Fluid Transport-Chemical Deposition Process produce, Mat. Res. Bull., 26, 1991, p.1127–33. The '093 patent is for traditional CVD without a flame or plasma torch and does not consider open atmosphere capable techniques such as CCVD, which has the associated advantages discussed above. Additionally, only supercritical fluid solutions are considered; liquid solutions near the supercritical point are not addressed. All of the precursors of the '093 patent are carried in the supercritical solution which can limit the usable precursors due to reactivity and solubility in supercritical fluids.

B. M. Merkle, R. N. Kniseley, F. A. Smith and I. E. Anderson, Superconducting YBaCuO Particulate produced by Total Consumption Burner Process produce, Mat. Sci. Eng., A124, p.31–38 (1990), J. McHale et al., Preparation of High-Tc Oxide Films via Flaming Solvent Spray, J. Supercond. 5 (6), p.511 (1992), and M. Koguchi et al., Preparation of $YBa_2Cu_3O_x$ Thin Film by Flame Pyrolysis, Jpn. J. Appl. Phys. 29 (1), p.L33 (1990) describe the use of a flame to deposit films in what was termed a "spray pyrolysis" technique. Both Merkle et al. and McHale et al. deposited $YBa_2Cu_3O_x$ from a combusted sprayed solution onto substrates, but the deposition conditions resulted in low quality pyrolysis and particulate type coatings. Koguchi et al. atomized a 0.03 mol/l aqueous solution and transported the resulting mist into a $H_2$-$O_2$ flame and deposited a 10 $\mu$m thick coating in 10 minutes on a yttria stabilized zirconia (YSZ) substrate heated by the flame with much of the sprayed material being lost in transport due to the method used. The temperature, measured at the back of the substrate, reached a maximum of 940° C. However, the flame side of the substrate is generally expected to be 100° C. to 300° C. higher in temperature than the back which would be in the melting range of $YBa_2Cu_3O_x$. The resulting Koguchi et al. film had a strong c-axis preferred orientation and, after a 850° C. oxygen anneal for eight hours, the film showed zero resistivity at 90° K. Koguchi et al. termed their method "flame pyrolysis," and were probably depositing at temperatures near the melting point of $YBa_2Cu_3O_x$. The solution concentrations and deposition rates were higher than those useful in CCVD processing. Therefore, there exists a need for a coating method which achieves excellent results at below the coating materials' melting point. The present invention fulfills this need because the finer atomization of the near supercritical fluid improves film quality by enabling the formation of vapor deposited films at lower deposition temperatures.

McHale et al. successfully produced 75 to 100 $\mu$m thick films of $YBa_2Cu_3O_x$ and $Bi_{1.7}Pb_{0.3}Ca_2Sr_2Cu_3O_{10}$ by combusting a sprayed solution of nitrates dissolved in liquid ammonia in a $N_2O$ gas stream, and by combusting nitrates dissolved in either ethanol or ethylene glycol in an oxygen gas stream. The results suggest the films were particulate and not phase pure. The $YBa_2Cu_3O_x$ coatings had to be annealed at 940° C. for 24 hours and the $Bi_{1.7}Pb_{0.3}Ca_2Sr_2Cu_3O_{10}$ coatings heat treated at 800° C. for 10 hours and then at 860° C. for 10 hours to yield the desired material. Even after oxygen annealing, zero resistivity could never be obtained at temperatures above 76° K. The solution concentrations used were not reported, but the deposition rates were excessively high. In both Koguchi's and McHale's methods, the reported solution and resulting film stoichiometries were identical. Conversely, in CVD and in the present invention, the solution stoichiometry may differ from the desired film stoichiometry. Additionally the resulting droplet size of sprayed solutions was excessively large and the vapor pressure too low for effective vapor deposition.

A nebulized solution of precursors has been used with a plasma torch in a process termed "spray inductively coupled plasma" ("spray-ICP" or "ICP"). See M. Kagawa, M. Kikuchi, R Ohno and T. Nagae, J. Amer. Ceram. Soc., 64, 1981, C7. In spray-ICP, a reactant containing solution is atomized into fine droplets of 1–2 mm in diameter which are then carried into an ICP chamber. This can be regarded as a plasma CVD process, different from flame pyrolysis. See M. Suzuki, M. Kagawa, Y. Syono, T. Hirai and K. Watanabe, J. Materials Sci., 26, 1991, p.5929–5932. Thin films of the oxides of Ce, La, Y, Pr, Nd, Sm, Cr, Ni, Ti, Zr, La—Sr—Cu, Sr—Ti, Zn—Cr, La—Cr, and Bi—Pb—Sr—Ca—Cu have successfully been deposited using this technique. See M. Suzuki, M. Kagawa, Y. Syono and T. Hirai, Thin films of Chromium Oxide Compounds Formed by the Spray-ICP Technique, J. Crystal Growth, 99, 1990, p.611–615 and M. Suzuki, M. Kagawa, Y. Syono and T. Hirai, Thin films of Rare-Earth (Y, La, Ce. Pr, Nd, Sm) Oxides Formed by the Spray-ICP Technique, J. Crystal Growth, 112, 1991, p.621–627. Holding the substrate at an appropriate distance from the plasma was crucial to synthesizing dense films. The range of desired deposition distances from the plasma source was small due to the rapid temperature drop of the gases. CVD type coatings were achieved using ultrasonically atomized 0.5–1.0 M solutions of metal-nitrates in water which were fed into the ICP at 6–20 ml/min using Ar flowing at 1.3–1.4 l/min. Only oxides were deposited and liquid or liquid-like solutions near the supercritical temperature were not used. The use of near supercritical atomization with ICP was not considered in this broad review of ICP nebulization techniques. See T. R. Smith and M. B. Denton, Evaluation of Current Nebulizers and Nebulizer Characterization Techniques, Appl. Spectroscopy, 44, 1990, p.21–4.

Therefore, it is highly desirable to be able to form nanopowders and coatings at low production and capitalization costs and with simple production processes. It is also desirable to be able to form coatings in the open atmosphere without any costly furnace, vacuum, or reaction chamber. It is further highly desirable to provide a coating process which provides for a high adhesion to the substrate, controlled microstructure, flexibility, reduced raw material consumption and reduced effect on the operating characteristics and/or dimensions of the coated system while being able to retain highly desirable submicron capabilities which are important to obtaining improved coating and powder formation. Moreover, it is highly desirable to provide a process which uses solutions near their supercritical point, and, therefore, achieves excellent results at below the coating materials' melting point.

SUMMARY OF THE INVENTION

The present invention fulfills these needs and defines plasma torch and CCVD produced vapor formed films, powders and nanophase coatings from near supercritical liquids and supercritical fluids. Preferably, a liquid or liquid-like solution fluid containing chemical precursor(s) is formed. The solution fluid is regulated to near or above the critical pressure and is then heated to near the supercritical temperature just prior to being released through a restriction or nozzle which results in a gas entrained very finely atomized or vaporized solution fluid. The solution fluid vapor is combusted to form a flame or is entered into a flame or electric torch plasma, and the precursor(s) react to the desired phase in the flame or plasma or on the substrate surface. Due to the high temperature of the plasma much of the precursor will react prior to the substrate surface. A substrate is positioned near or in the flame or electric plasma, and a coating is deposited. Alternatively, the material formed can be collected as a nanophase powder.

The method of the present invention provides for very fine atomization, nebulization, vaporization or gasification by using solution fluids near or above the critical pressure and near the critical temperature. The dissolved chemical precursor(s) need not have high vapor pressure, but high vapor pressure precursors can work well or better than lower vapor pressure precursors. By heating the solution fluid just prior to or at the end of the nozzle or restriction tube (atomizing device), the available time for precursor chemical reaction or dissolution prior to atomization is minimized. This method can be used to deposit coatings from various metalorganics and inorganic precursors. The fluid solution solvent can be selected from any liquid or supercritical fluid in which the precursor(s) can form a solution. The liquid or fluid solvent by itself can consist of a mixture of different compounds.

A reduction in the supercritical temperature of the reagent containing fluid demonstrated superior coatings. Many of these fluids are not stable as liquids at STP, and must be combined in a pressure cylinder or at a low temperature. To ease the formation of a liquid or fluid solution which can only exist at pressures greater than ambient, the chemical precursor(s) are optionally first dissolved in primary solvent that is stable at ambient pressure. This solution is placed in a pressure capable container, and then the secondary (or main) liquid or fluid (into which the primary solution is miscible) is added. The main liquid or fluid has a lower supercritical temperature, and results in a lowering of the maximum temperature needed for the desired degree of nebulization. By forming a high concentration primary solution, much of the resultant lower concentration solution is composed of secondary and possible additional solution compounds. Generally, the higher the ratio of a given compound in a given solution, the more the solution properties behave like that compound. These additional liquids and fluids are chosen to aid in the very fine atomization, vaporization or gasification of the chemical precursor(s) containing solution. Choosing a final solution mixture with low supercritical temperature additionally minimizes the occurrence of chemical precursors reacting inside the atomization apparatus, as well as lowering or eliminating the need to heat the solution at the release area. In some instances the solution may be cooled prior to the release area so that solubility and fluid stability are maintained. One skilled in the art of supercritical fluid solutions could determine various possible solution mixtures without undue experimentation. Optionally, a pressure vessel with a glass window, or with optical fibers and a monitor, allows visual determination of miscibility and solute-solvent compatibility. Conversely, if in-line filters become clogged or precipitant is found remaining in the main container, an incompatibility under those conditions may have occurred.

The resulting powder size produced by the methods and apparatuses of the present invention can be decreased, and therefore, improved by: 1) decreasing the concentration of the initial solution; 2) decreasing the time in the hot gasses; 3) decreasing the size of the droplets formed; and/or 4) increasing the vapor pressure of the reagent used. Each of the variables has other considerations. For instance, economically, the concentration of the initial solution should be maximized to increase the formation rate, and lower vapor pressure reagents should be used to avoid the higher costs of many higher vapor pressure reagents. Decreasing the time in the hot gasses is countered by the required minimum time of formation of the desired phase. Decreasing the size of the droplets formed can entail increased fluid temperature which is countered by possible fluid reaction and dissolution effects. Similarly, coating formation has parallel effects and relationships.

Another advantage is that release of fluids near or above their supercritical point results in a rapid expansion forming a high speed gas-vapor stream. High velocity gas streams effectively reduce the gas diffusion boundary layer in front of the deposition surface which, in turn, improves film quality and deposition efficiency. When the stream velocities are above the flame velocity, a pilot light or other ignition means must be used to form a steady state flame. In some instances two or more pilots may be needed to ensure complete combustion. With the plasma torch, no pilot lights are needed, and high velocities can be easily achieved by following operational conditions known by one of ordinary skill in the art.

The solute containing fluid need not be the fuel for the combustion. Noncombustible fluids like water or $CO_2$, or difficult to combust fluids like ammonia, can be used to dissolve the precursors or can serve as the secondary solution compound. These are then expanded into a flame or plasma torch which provides the environment for the precursors to react. The depositions can be performed above, below or at ambient pressure. Plasma torches work well at reduced pressures. Flames can be stable down to 10 torr, and operate well at high pressures. Cool flames of even less than 500° C. can be formed at lower pressures. While both can operate in the open atmosphere, it can be advantageous to practice the methods of the invention in a reaction chamber under a controlled atmosphere to keep airborne impurities from being entrained into the resulting coating. Many electrical and optical coating applications require that no such impurities be present in the coating. These applications normally require thin films, but thicker films for thermal barrier, corrosion and wear applications can also be deposited.

Further bulk material can be grown, including single crystals, by extending the deposition time even further. The faster epitaxial deposition rates provided by higher deposition temperatures, due to higher diffusion rates, can be necessary for the deposition of single crystal thick films or bulk material.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION OF THE PREFERRED EMBODIMENTS

Figure 1:
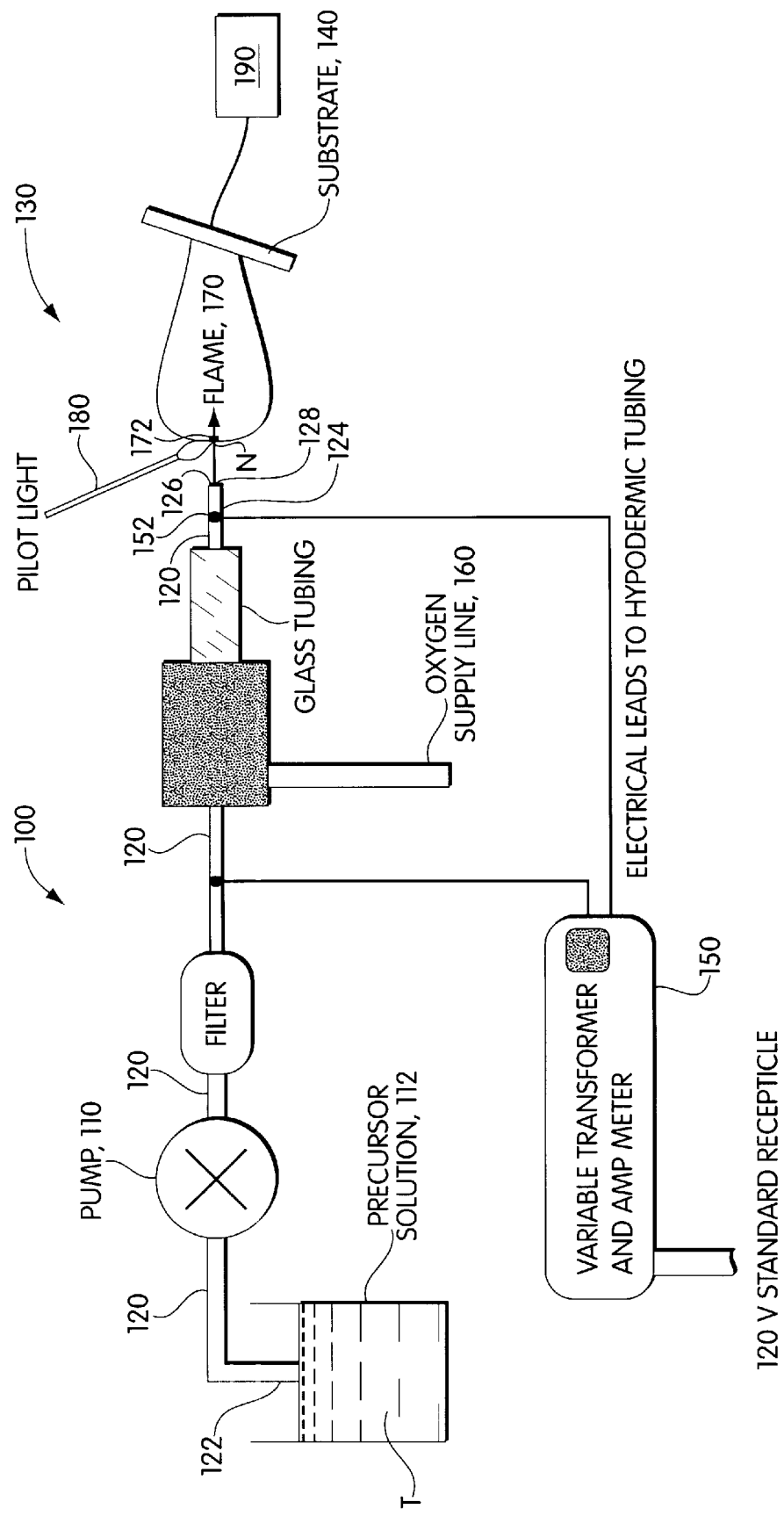
FIG. 1 shows a schematic diagram of the apparatus of the invention.

The present invention may be understood more readily by reference to the following detailed description of preferred embodiments of the invention and the Figures.

Before the present methods and apparatuses are disclosed and described, it is to be understood that the terminology used herein is for the purpose of describing particular embodiments only and is not intended to be limiting. It must be noted that, as used in the specification and the appended claims, the singular forms "a," "an" and "the" include plural referents unless the context clearly dictates otherwise.

Throughout this application, where publications are referenced, the disclosures of these publications in their entireties are hereby incorporated by reference into this application in order to more fully describe the state of the art to which this invention pertains.

The present invention provides a method for coating a substrate with a selected material. The method comprises, at a first selected temperature and a first selected pressure, dissolving into a suitable carrier to thereby form a transport solution one or more reagents capable of reacting (where, for a single precursor reagent, the precipitation of the reagent from the solution is herein considered a "reaction") to form the selected material. At some time prior to the actual deposition, a substrate is positioned in a region having a second selected pressure. The second selected pressure can be ambient pressure and is generally above 20 torr. The transport solution is then pressurized to a third selected pressure above the second selected pressure using a pressure regulating means. One of skill in the art would recognize that there are many suitable pressure regulating means, including, but not limited to compressors, etc. Next, the pressurized, transport solution is directed to a fluid conduit having an input end and an opposed output end having a temperature regulating means positioned thereon for regulating the temperature of the solution at the output end. The output end of the conduit further comprises an outlet port oriented to direct the fluid in the conduit into the region and in the direction of the substrate. The outlet port can be of a shape similar to a nozzle or restrictor as used in other spraying and CVD applications. Thereafter, the solution is heated using the temperature regulating means to a second selected temperature within 50° C. above or below the critical temperature, $T_c$, of the solution while maintaining the third selected pressure above the second selected pressure and above the corresponding liquidus or critical pressure, $P_c$, of the solution at the second selected temperature using the pressure regulating means. Then, the pressurized, heated solution is directed through the outlet port of the conduit into the region to produce a nebulized solution spray in the direction of the substrate. As the solution is directed into the region, one or more selected gases are admixed into the nebulized solution spray to form a reactable spray and, thereafter, this reactable spray is exposed to an energy source at a selected energization point. The energy source provides sufficient energy to react the reactable spray (which contains the one or more reagents of the transport solutions) thereby forming the material and coating the substrate therewith.

In a further embodiment of this method, the energy source comprises a flame source and the selected energization point comprises an ignition point. In an alternate embodiment, the energy source comprises a plasma torch.

In a further embodiment of the method, the second selected pressure of the region is ambient pressure.

In yet another embodiment, the nebulized solution spray is a vapor or an aerosol having a maximum droplet size of less than 2 $\mu$m.

In a further embodiment, the second selected pressure of the region is reduced to produce a combustion flame having a temperature of less than 1000° C.

In yet another embodiment, the carrier is propane and the transport solution comprises at least 50% by volume propane. In a further embodiment, the transport solution further includes butanol, methanol, isopropanol, toluene, or a combination thereof In yet another embodiment, the carrier is selected such that the transport solution is substantially precipitate free at standard temperature and pressure for a period of time sufficient to carry out the method.

In an alternate embodiment of the method, a pressurized container is used and before, during or after the pressuring step, a standard temperature and pressure gas is also contacted with the transport solution at a selected pressure sufficient to form a liquid or supercritical fluid (depending upon the temperature). In a preferred embodiment, the transport solution containing the standard temperature and pressure gas is substantially precipitate free at the selected pressure for a period of time sufficient to carry out the method. In yet another embodiment, the reagent concentration of the transport solution is between 0.0005 M and 0.05 M.

In a further embodiment, the outlet end of the conduit further comprises a fluid introduction port and, prior to directing the pressurized, heated solution through the outlet port of the conduit, fluid is added to the pressurized, heated solution through the fluid introduction port. Such introduction forms a combined solution having a reduced supercritical temperature.

In yet another embodiment, each of the one or more reagents has a vapor pressure of no less than about 25% of the vapor pressure of the carrier.

In a further embodiment, the outlet end of the conduit comprises tubing having an internal diameter of 2 to 1000 $\mu$m, more preferably 10 to 250 $\mu$m. In a more preferable embodiment, the outlet end of the conduit comprises tubing having an internal diameter of 25 to 125 µm. In yet a further preferable embodiment, the outlet end of the conduit comprises tubing having an internal diameter of 50 to 100 µm.

In another embodiment, the temperature regulating means comprises means for resistively heating the conduit by applying thereto an electric current of a selected voltage from an electric current source. In a preferred embodiment, the voltage is less than 115 Volts. In yet another preferred embodiment, the means for resistively heating the conduit comprises a contact positioned within 4 mm of the outlet port.

Moreover, the present invention also provides the above method wherein the carrier and one or more reagents are selected such that the second selected temperature is ambient temperature.

The above method may be practiced wherein the material that coats the substrate comprises a metal. Alternatively, the material that coats the substrate comprises one or more metal oxides. In a further alternative embodiment, the material that coats the substrate comprises a carbonate, a sulfate, or a phosphate. In yet a further embodiment, the material that coats the substrate comprises at least 90% silica.

In a further embodiment, the reactable spray comprises a combustible spray having a combustible spray velocity and wherein the combustible spray velocity is greater than the flame speed of the flame source at the ignition point and further comprising one or more ignition assistance means for igniting the combustible spray. In a preferred embodiment, each of the one or more ignition assistance means comprises a pilot light. In yet another embodiment, the combustible spray velocity is greater than mach one.

In a further embodiment, the ignition point or flame front is maintained within 2 cm. of the outlet port.

The present invention also provides a method where, during the exposing step, cooling the substrate using a substrate cooling means. In a preferred embodiment, the substrate cooling means comprises a means for directing water onto the substrate. However, one of ordinary skill in the art would recognize that many other suitable cooling means could be used.

In a further embodiment, the material that coats the substrate comprises a carbonaceous material. In another embodiment, the material that coats the substrate comprises diamond. In an alternate embodiment, the material that coats the substrate comprises (1) diamond and (2) a metal oxide or a metal. In a further embodiment, the material that coats the substrate has a thickness of less than 100 nm. In yet another embodiment, the material that coats the substrate comprises a graded composition. In another embodiment, the material that coats the substrate comprises an amorphous material. In a further embodiment, the material that coats the substrate comprises a nitride, carbide, boride, metal or other non-oxygen containing material.

The present invention also provides a method further comprising flowing a selected sheath gas around the reactable spray thereby decreasing entrained impurities and maintaining a favorable deposition environment.

In a preferred embodiment, the second selected pressure is above 20 torr.

In addition to the above methods, the present invention also provides an apparatus for coating a substrate with a selected material. Referring now to FIG. 1, the apparatus 100 comprises a pressure regulating means 110, such as a pump, for pressurizing to a first selected pressure a transport solution T (also called "precursor solution") in a transport solution reservoir 112, wherein the transport solution T comprises a suitable carrier having dissolved therein one or more reagents capable of reacting to form the selected material and wherein the means for pressurizing 110 is capable of maintaining the first selected pressure above the corresponding liquidus (if the temperature is below $T_c$) or critical pressure, $P_c$, of the transport solution T at the temperature of the transport solution T, a fluid conduit 120 having an input end 122 in fluid connection with the transport solution reservoir 112 and an opposed output end 124 having an outlet port 126 oriented to direct the fluid in the conduit 120 into a region 130 of a second selected pressure below the first selected pressure and in the direction of the substrate 140, wherein the outlet port 126 further comprises means 128 (see FIGS. 2 and 3, atomizer 4) for nebulizing a solution to form a nebulized solution spray N, a temperature regulating means 150 positioned in thermal connection with the output end 124 of the fluid conduit 120 for regulating the temperature of the solution at the output end 124 within 50° C. above or below the supercritical temperature, $T_c$, of the solution, a gas supply means 160 for admixing one or more gases (e.g., oxygen) (not shown) into the nebulized solution spray N to form a reactable spray, an energy source 170 at a selected energization point 172 for reacting the reactable spray whereby the energy source 170 provides sufficient energy to react the reactable spray in the region 130 of the second selected pressure thereby coating the substrate 140.

In a further embodiment of the apparatus, the energy source 170 comprises a flame source and the selected energization point 172 comprises an ignition point. In an alternate embodiment, the energy source 170 comprises a plasma torch. In yet another embodiment, the outlet port 126 further comprises a pressure restriction (see FIG. 3, restrictor 7).

In a further embodiment of the apparatus, the second selected pressure of the region is ambient pressure.

In yet another embodiment, the nebulized solution spray N is a vapor or an aerosol having a maximum droplet size of less than 2 $\mu$m.

In a further embodiment, the second selected pressure of the region is reduced to produce a combustion flame having a temperature of less than 1000° C.

In yet another embodiment, the carrier is propane and the transport solution comprises at least 50% by volume propane. In a further embodiment, the transport solution further includes butanol, methanol, isopropanol, toluene, or a combination thereof. In yet another embodiment, the carrier is selected such that the transport solution is substantially precipitate free at standard temperature and pressure for a period of time sufficient to carry out the method.

In an alternate embodiment of the apparatus, a pressurized container (not shown) is provided and a standard temperature and pressure gas is also contacted with the transport solution at a selected pressure sufficient to form a liquid or supercritical fluid. In a preferred embodiment, the transport solution containing the standard temperature and pressure gas is substantially precipitate free at the selected pressure for a period of time sufficient to carry out the method. In yet another embodiment, the reagent concentration of the transport solution is between 0.0005 M and 0.05 M.

In a further embodiment, the outlet end 124 of the conduit 120 further comprises a fluid introduction port (see FIG. 2, feed lines 17 or 19) and, prior to directing the pressurized, heated solution through the outlet port 126 of the conduit 120, fluid is added to the pressurized, heated solution through the fluid introduction port. Such introduction forms a combined solution having a reduced supercritical temperature.

In yet another embodiment, each of the one or more reagents has a vapor pressure of no less than about 25% of the vapor pressure of the carrier.

In a further embodiment, the outlet end of the conduit comprises tubing having an internal diameter of 2 to 1000 µm, more preferably 10 to 250 µm. In a more preferable embodiment, the outlet end of the conduit comprises tubing having an internal diameter of 25 to 125 µm. In yet a further preferable embodiment, the outlet end of the conduit comprises tubing having an internal diameter of 50 to 100 µm.

In another embodiment, the temperature regulating means 150 comprises means for resistively heating the conduit by applying thereto an electric current of a selected voltage from an electric current source. In a preferred embodiment, the voltage is less than 115 Volts. In yet another preferred embodiment, the means for resistively heating the conduit comprises a contact 152 positioned within 4 mm of the outlet port 126.

Moreover, the present invention also provides the above apparatus wherein the carrier and one or more reagents are selected such that the second selected temperature is ambient temperature.

The above apparatus may be used wherein the material that coats the substrate 140 comprises metal. Alternatively, the material that coats the substrate 140 comprises one or more metal oxides. In a further alternative embodiment, the material that coats the substrate 140 comprises a carbonate, a sulfate, or a phosphate. In yet a further embodiment, the material that coats the substrate 140 comprises at least 90% silica.

In a further embodiment, the reactable spray comprises a combustible spray having a combustible spray velocity and wherein the combustible spray velocity is greater than the flame speed of the flame source at the ignition point 172 and further comprising one or more ignition assistance means 180 for igniting the combustible spray. In a preferred embodiment, each of the one or more ignition assistance means 180 comprises a pilot light. In yet another embodiment, the combustible spray velocity is greater than mach one.

In a further embodiment, the ignition point 172 or flame front is maintained within 2 cm. of the outlet port.

The present invention also provides a substrate cooling means 190 for cooling the substrate 140. In a preferred embodiment, the substrate cooling means 190 comprises a means for directing water onto the substrate 140. However, one of ordinary skill in the art would recognize that many other suitable cooling means could be used.

In a further embodiment, the material that coats the substrate 140 comprises a carbonaceous material. In another embodiment, the material that coats the substrate 140 comprises diamond. In an alternate embodiment, the material that coats the substrate 140 comprises (1) diamond and (2) a metal oxide or a metal. In a further embodiment, the material that coats the substrate 140 has a thickness of less than 100 nm. In yet another embodiment, the material that coats the substrate 140 comprises a graded composition. In another embodiment, the material that coats the substrate 140 comprises an amorphous material. In a further embodiment, the material that coats the substrate 140 comprises a nitride, carbide, boride, metal or other non-oxygen containing material.

The present invention also provides an apparatus further comprising a means (see FIGS. 2 and 3, feed line 17 or 19) for flowing a selected sheath gas around the reactable spray thereby decreasing entrained impurities and maintaining a favorable deposition environment.

In a preferred embodiment, the second selected pressure is above 20 torr.

In addition, the present invention also provides a method for creating a powdered material in a region. This powder forming method comprises, at a first selected temperature and a first selected pressure, dissolving into a suitable carrier to thereby form a transport solution one or more reagents capable of reacting to form the powdered material in the region, wherein the region has a second selected pressure lower than the first selected pressure. The powder forming method then involves pressurizing the transport solution to a third selected pressure above the second selected pressure using a pressure regulating means. Thereafter, the pressurized, transport solution is directed to a fluid conduit having an input end and an opposed output end having a temperature regulating means positioned thereon for regulating the temperature of the solution at the output end, wherein the output end further comprises an outlet port oriented to direct the fluid in the conduit into the region. The solution is then heated using the temperature regulating means to a second selected temperature within 50° C. above or below the critical temperature, $T_c$, of the solution while maintaining the third selected pressure above the second selected pressure and above the corresponding liquidus or critical pressure, $P_c$, of the solution at the second selected temperature using the pressure regulating means. The pressurized, heated solution is then directed through the outlet port of the conduit into the region to produce a nebulized solution spray. One or more selected gases are admixed into the nebulized solution spray to form a reactable spray. Finally, the reactable spray is exposed to an energy source at a selected energization point whereby the energy source provides sufficient energy to react the reactable spray thereby forming the powdered material in the region.

In a further embodiment of the method, the energy source comprises a flame source and the selected energization point comprises an ignition point. In an alternate embodiment, the energy source comprises a plasma torch.

In a further embodiment, the powder-forming method may be used to coat a particular substrate. For this method, the above method is modified such that the method further comprises admixing a selected substrate material with the transport solution.

In a further preferred embodiment of the powder forming method, the transport solution concentration is between 0.005 M and 5 M.

In another embodiment, the present invention provides an apparatus for creating a powdered material, comprising a pressure regulating means for pressurizing to a first selected pressure a transport solution in a transport solution reservoir, wherein the transport solution comprises a suitable carrier having dissolved therein one or more reagents capable of reacting to form the selected material and wherein the means for pressurizing is capable of maintaining the first selected pressure above the corresponding liquidus or critical pressure, $P_c$, of the transport solution at the temperature of the transport solution, a fluid conduit having an input end in fluid connection with the transport solution reservoir and an opposed output end having an outlet port oriented to direct the fluid in the conduit in the direction of a region of a second selected pressure lower than the first selected pressure, wherein the outlet port further comprises means for nebulizing a solution to form a nebulized solution spray, a temperature regulating means positioned on the output end of the fluid conduit for regulating the temperature of the solution at the output end, a gas supply means for admixing one or more gases into the nebulized solution spray to form a reactable spray, and an energy source at a selected energization point for reacting the reactable spray whereby the energy source provides sufficient energy to react the reactable spray in the region of the second selected pressure thereby forming the powdered material. The apparatus is similar to the coating apparatus, except that no substrate is positioned in the region and, instead, the powder is collected.

In addition, the present invention provides a coating on a substrate produced by the process described above. In addition, the present invention provides a powder produced by the process described above.

A flame requires that some oxidant be present. Thus, materials which are not stable in the presence of oxidants cannot be formed using a flame. See C. H. P. Lupis, "Chemical Thermodynamics of Materials", Elsevier Science Publishing, 1993. Instead, these materials are deposited using a plasma torch. When using a plasma torch, a sheath gas, plasma enclosure tube, and/or reaction chamber is necessary to maintain an air and oxidant free environment. Because of the instability in the presence of oxidants, the fluid and gasses used should not contain oxidizer elements. Additionally, the use of hydrocarbon compounds can result in the deposition of extensive carbon. While some carbon is needed for the formation of carbides, too much carbon could result in high C coatings, and possible elemental carbon. In such cases the solution concentration should be increased, or a low carbon or carbon free containing fluid should be used. One skilled in the art of combustion could determine, with only routine experimentation, the adjustments which would minimize the deposition or incorporation of elemental carbon. This deposition is also called "fouling" or "carbon buildup" in burner and engine applications. For the deposition of nitrides, a plasma torch should be used, and ammonia is one of the suitable solvents. Metal films can be deposited from chemical systems with no or low concentrations of anions from thermodynamically stable phases. In a brief example, if Ti metal was desired, then the concentration of C, N, and B would preferably be low, and almost no Cl, F or O containing compounds would be present. When using the plasma torch, it is easier to deposit oxygen stable materials because the sheath gas or enclosure tube need not be used. However, the cost of the flame deposited and formed materials is less, and thus is preferred for materials thermodynamically stable in environments containing sufficient oxygen to maintain a flame.

It may be desired to form a coating completely or partially composed of elemental carbon, in which case all elemental oxygen and reactive oxygen containing compounds must be kept separated from the carbon film as long as the film temperature is such that the oxidation of carbon is thermodynamically favored over the presence of elemental carbon. If trace amounts of oxygen are present one can make the reaction atmosphere more reducing by supplying elemental hydrogen. Diamond and diamond like carbon coatings can be deposited from an oxygen containing flame, and the necessary deposition conditions are known to one skilled in the art. The addition of dopants or a second phase to the carbon coating can be accomplished by adding a reagent to the flame or plasma by the use of this present invention.

To simplify the operation, it is helpful to pump the precursor/solvent solution to the atomizing device at room temperature. Heating of the solution should occur as a final step just prior to release of the solution into the lower pressure region. Such late stage heating minimizes reactions and immiscibilities which occur at higher temperatures. Keeping the solution below the supercritical temperature until atomization maintains the dissolved amounts of precursor in the region of normal solubility and reduces the potential of developing significant solvent-precursor concentration gradients in the solution. These solubility gradients are a result of the sensitivity of the solution strength of a supercritical solvent with pressure. Small pressure gradients (as they can develop along the precursor-solvent system delivery) can lead to significant changes in solubility as has been observed. For instance, the solubility of acridine in carbon dioxide at 308 ° K. can be increased 1000 times by increasing the pressure from 75 atm to 85 atm. See V. Krukonis, "Supercritical Fluid Nucleation of Difficult to Comnminute Solids", Presented at AIChE Meeting, San Francisco, Nov. 25–30, 1984. Such solubility changes are potentially detrimental because they may cause the precursor to be driven out of solution and precipitate or react prematurely, clogging lines and filters.

The rapid drop in pressure and the high velocity at the nozzle cause the solution to expand and atomize. For solute concentrations in the normal solubility range, preferred for operation of the near supercritical atomization system of the present invention, the precursors are effectively still in solution after being injected into the low pressure region. The term "effectively in solution" must be understood in conjunction with processes taking place when a solution with solute concentrations above the normal solvent strength is injected into the low pressure region. In this case, the sudden pressure drop causes high supersaturation ratios responsible for catastrophic solute nucleation conditions. If the catastrophic nucleation rapidly depletes the solvent from all dissolved precursor, the proliferation of small precursor particles is enhanced. See D. W. Matson, J. L. Fulton, R. C. Petersen and R. D. Smith, "Rapid Expansion of Supercritical Fluid Solutions: Solute Formation of Powders, Thin Films, and Fibers", Ind. Eng. Chem. Res., 26, 2298 (1987); H. Anderson, T. T. Kodas and D. M. Smith, "Vapor Phase Processing of Powders: Plasma Synthesis and Aerosol Decomposition", Am. Ceram. Soc. Bull., 68, 996 (1989); C. J Chang and A. D Randolph, "Precipitation of Microsize Organic Particles from Supercritical Fluids", AIChE Journal, 35, 1876 (1989); T. T. Kodas, "Generation of Complex Metal Oxides by aerosol Processes: Superconducting Ceramic Particles and Films", Adv. Mater., 6, 180 (1989); E. Matijevic, "Fine Particles: Science ad Technology", MRS Bulletin, 14, 18 (1989); E. Matijevic, "Fine Particles Part II: Formation Mechanisms and Applications", MRS Bulletin, 15, 16 (1990); R. S. Mohamed, D. S. Haverson, P. G. Debenedetti and R. K. Prud'homme, "Solid Formation After Expansion of Supercritical Mixtures," in Supercritical Fluid Science and Technology, edited by K. P. Johnston and J. M. L. Penniger, p.355, American Chemical Society, Washington, D.C. (1989); R. S. Mohamed, P. G. Debenedetti and R. K. Prud'homme, "Effects of Process Conditions on Crystals Obtained from Supercritical Mixtures", AIChE J., 35, 325 (1989); J. W. Tom and P. G. Debenedetti, "Formation of Bioerodible Polymeric Microspheres and Microparticles by Rapid Expansion of Supercritical Solutions", Biotechnol. Prog., 7, 403 (1991). Particles are undesirable for the formation of thin coatings, but can be beneficial during the formation of powders.

Thus the heated atomizer of the present invention provides the further superior advantages, compared to an unheated device that operates on rapid expansion of a solvent at exclusively above the supercritical temperature, that (1) the temperature allows for a well controlled degree of atomization of the precursor-solvent mixture and (2) catastrophic nucleation of the precursors can be omitted while still enjoying the benefits of supercritical atomization. Supersonic velocities can be created forming a mach disk which additionally benefits atomization.

By adjusting the heat input into the atomizing device, the liquid solution can be vaporized to various degrees. With no heat input to the atomizing device, liquid solutions of higher supercritical temperature liquids, that are liquids at STP, can exit in the form of a liquid stream which is clearly far from a supercritical condition. This results in a poorly formed flame and, possibly, undesirable liquid contact with the substrate. Decreasing the temperature differential of the liquid solution to its supercritical temperature at the nozzle causes the liquid solution to break up into droplets forming a mist which is released from the atomizing device. The droplets vaporize, and thus become invisible, after a short distance. As the supercritical temperature at the atomizing device is approached, the liquid solution droplets decrease in size, and the distance to solution vaporization is decreased. Using this atomizer the vapor droplet size was determined using an aerosol vaporization tester and the obtained droplet size was below the 1.8 mm detection limit of the instrument.

Further increasing the heat input results in a state of no mist at the tip, or complete vaporization. Without wishing to be bound by theory, this behavior of the solution can be attributed to the combined supercritical properties of the reagents and solvents. Solutions of precursors in lower supercritical temperature solvents, that are gasses at STP, behave similarly, but the emerging solution from the tip (also referred to as the "nozzle" or "restrictor") does not form a liquid stream, even without heat input. The amount of heat needed to obtain optimal vaporization of the solution depends mostly on the heat capacity of the solution and the differential between the supercritical temperature of the solvent and the ambient temperature around the nozzle.

It is desirable to maintain the pressure and temperature of the system (before vaporization) above the boiling and the supercritical point of the solution. If the pressure falls below the liquidus or critical pressure, coincident with the temperature above the boiling point, vaporization of the solvents will occur in the tube prior to the tip. This leaves the solutes which can build up and clog the atomizing device. Similarly the pressure is preferably sufficiently high in the supercritical region so that the fluid is more liquid-like. Liquid-like supercritical fluids are better solvents than more gas-like supercritical fluids, further reducing the probability of solutes clogging the atomizing device. If the precursor-to-precursor interaction is higher than the strength between solvent and precursor, the solvent-precursor bonds can be broken and effectively drive the precursor out of solution. Precursor molecules then form clusters that adhere to the atomizing device and clog the restrictor. The problem can be solved, in most cases, by shifting the vaporization point from the inside of the tip to the end of the tip, which is accomplished by reducing the heat input into the atomizing device. Another solution is to use a solvent which forms stronger bonds with the precursor so a more stable solution is formed. A small amount of mist at the tip usually results in the best quality thin films. Nano- or micro-spheres of the material will form if the temperature of the solution it too high or too low. These spheres are detrimental if dense coatings are desired.

If the no-mist condition is reached, the deposition is being performed above the critical temperature. The heat of the flame and mixing with external gasses keeps STP liquid solvents from condensing and forming droplets. In the no-mist instance, atomization and intermixing is very good but flow stability is reduced, resulting in a flame that can jump from side to side with respect to the direction of the tip. With such a flame behavior, depositions remain possible, but it can be difficult to deposit films requiring stringent thickness uniformity. Additionally, it is necessary to maintain the temperature of the solution, prior to release, below the temperature where either the solute precipitates or reacts and precipitates. When using a solvent mixture it may be possible during heating to cross the line for spinoidal immiscibility. This causes the formation of two separate phases, with the possibility of concentration differences in the two phases due to different solubilities of the solutes. This may influence the formation of precursor and product spheres at high atomization temperatures. All of these factors demonstrate the preferability of minimizing the solution's exposure to heating, if necessary, until the tip so that possible unwanted equilibrium condition states of matter do not have sufficient time to transpire. The structure of the films deposited can thus be precisely controlled.

Due to this control, a number of film microstructures are possible. By increasing solution concentration it is possible to increase the deposition rate and the following microstructural changes result with increasing solution concentration; dense to porous, specular to dull, smooth to rough, columnar to hillocks, and thin to thick. Graded and multilayered coatings can also be produced. See Example VI. Multilayers can be formed by supplying different precursor containing solutions to an individual flame. Sequential multiple deposition flames may be used to increase throughput for production applications. Some additional factors controlling deposition parameters include; substrate surface temperature which controls surface diffusion and nucleation; pressure which controls boundary layer thickness and thus deposition rate, solution composition and mix gasses varies the material being deposited and thus the coatings growth habit, Flame and plasma energy level effects where the reaction occurs and vapor stability, and the distance to the substrate effects the time from nebulization to reaction to deposition which can lead to particle formation or increased diffusion time for larger clusters. Additionally, electric and magnetic fields affect the growth habits of some materials, or increase deposition efficiency. One of ordinary skill in the art would recognize that such electric and magnetic fields will affect the growth habits of some vapor deposited materials, as well as vary the particular deposition rate and efficiency.

Because the required energy input into the solution heating atomizer varies for different precursor/primary-solvent/secondary-solvent solutions, it is preferred to deposit multilayer thin films from solutions with constant primary to secondary solvent ratios. In so doing, it is not necessary to change the energy input to the atomizer when switching from one solution to another solution. The resulting simplification of the setup produces increased performance and reliability while reducing costs. Alternatively, the substrate can be passed by flames containing different reagents to build the desired multilayer.

A major difference between the use of flame fluids and plasma fluids is that, often, the flame solution concentrations must be related to the desired flame energy level. High solution concentrations may lead to porous coatings or tube clogging. More dilute solutions, higher vapor pressure precursors, higher deposition temperatures and/or higher mobility and diffusion deposition compounds require less solution fluid heating to achieve dense coatings. Low vapor pressure precursors can form high quality coatings, but the atomization and deposition parameters have less variability than is possible for high vapor pressure reagents. However, very low solution concentration yields unacceptably low deposition rates.

When the solution provides the fuel for combustion, concentrations up to 0.1 molar result in dense coatings depending on the material. Most materials have preferred concentrations of up to 0.01 molar. Materials with lower diffusion and mobility need solution concentrations of less than 0.002. Solution concentrations of less than 0.0001 molar result in very slow deposition rates for most materials. Plasma torch and flame depositions with added combustible materials can have higher concentrations, even exceeding 1 M, but for the preferable vapor formation of the precursors, high concentrations are less desirable unless the precursor(s) have high vapor pressures. Low vapor pressure precursor solution concentrations are preferably less than 0.002 molar.

Without wishing to be bound by theory, it is helpful to understand that the principle of the deposition technique of the present invention involves the finding that CVD its not limited to reactions at the surface. See Hunt, A. T., "Combustion Chemical Vapor Deposition, a Novel Thin Film Deposition Technique", Ph.D. Thesis Georgia Inst. of Tech, Atlanta, Ga., (1993); Hunt, A. T., "Presubstrate Reaction CVD, and a Definition for Vapor", presented at the 13th Int. Conf. on CVD, Los Angles, Calif. (1996), the contents of which are hereby incorporated by this reference. Reactions can occur predominately in the gas stream, but the resulting material which is deposited must be subcritical in size to yield a coating with vapor deposited microstructures. These observations demonstrate that a vapor is composed of individual atoms, molecules or nanoclusters which can be absorbed onto a substrate and readily diffused into lower energy sites or configurations. Thus the maximum cluster size must decrease with lower substrate temperatures as does the critical nucleus size. It is known by one of ordinary skill in the art that reagent clusters are left after vaporization of the solvents, and the cluster size is related to the reagent vapor pressure, initial droplet size and the solution concentration. Therefore, atomization of low vapor pressure reagents, which therefore do not vaporize in the flame, must be very fine.

Preferred liquid solvents are low cost solvents include, but are not limited to, ethanol, methanol, water, isopropanol and toluene. Water solutions must be fed into a preexisting flame, while the combustible solvents can themselves be used to form the flame. It is preferable, but not required, to form the bulk of the flame using the solution rather than feeding the solution into a flame. Lower reagent concentration results this way, which eases the formation of subcritical nucleus sized materials.

One preferred solvent and secondary solution fluid which is propane, which is a gas at STP. However, it must be noted that many other solvent systems are operable. See, e.g., *CRC Handbook of Chemistry and Physics*. CRC Press, Boca Raton, Fla. Propane is preferred because of its low cost, its commercial availability, and its safety. Many low cost organometalics can be used in a predominately propane solution. To ease handling, the initial precursors can be dissolved in methanol, isopropanol, toluene or other solvents compatible with propane. This initial solution is then placed into a container into which liquid propane is added. Propane is a liquid at above only about 100 psi at room temperatures. The resulting solution has a much lower supercritical point than the initial solution which eases atomization by lowering the required energy input into the atomizer. Additionally, the primary solvent acts to increase the polar solubility of the propane, thus allowing higher solution concentrations for many reagents than would otherwise be achieved by propane alone. As a general rule, the polarity of the primary solvent should increase with increasing polarity of the solute (precursor). Isopropanol can thus aid in the solubility of a polar solute better than toluene. In some cases the primary solvent acts as a shield between the secondary solvent and a ligand on the solute. One example is the dissolution of platinum-acetylacetonate [$Pt(CH_3COCHCOCH_3)_2$] in propane, where the weight ratios between precursor/primary solvent and primary solvent/secondary solvent can be higher than those required in other systems.

Ammonia has been considered and tested as a secondary solvent for the deposition of coatings and powders. While ammonia is an inexpensive solvent that is compatible with nitrite based precursors, it is not easily usable with other secondary solvents and problems stem from the general aggressiveness of pure ammonia. The atomization properties of ammonia were tested without the addition of a precursor and the used pressure vessel was significantly attacked after the experiment even when an inert Type-316 stainless steel vessel was used. In contrast to hydrocarbon based solvents, ammonia also renders Buna-N and Viton gaskets useless after only a few minutes. Even with a suitable gasket material this is a problem since the desired coatings or powders usually must not contain traces of iron washed from the pressure vessel wall.

Other gas-like secondary solvents that were tested and can be used include ethane, ethylene, ethane/ethylene mixture, propane/ethylene mixture, and propane/ethane mixture. Ethane and ethylene secondary solvents were used to coat sapphire single crystal substrates with YSZ and YSZ-Alumina thin films resulting in good quality dense films. Platinum thin films were deposited from a supercritical mixture of ethane and a platinum metalorganic. LCS and PLZT thin films were deposited from supercritical ethane mixtures. For these depositions, an unheated nozzle was used such that the precursor solution underwent rapid expansion atomization only. A large ID ("internal diameter") nozzle (compared to the orifice) with a small orifice was used. Since the orifice is only about 0.1 mm long (in the direction of the flowing precursor solution), the pressure gradient across the restriction approximates a discontinues transition. This sudden pressure drop allows for an adiabatic expansion of the solvent. The processes that take place in such a rapidly expanding non equilibrium systems have been studied for various supercritical systems. See, e.g., C. R. Yonker, S. L. Frey, D. R. Kalkwarf and R. D. Smith, "Characterization of Supercritical Fluid Solvents Using Solvatochromatic Shifts," J. Phys. Chem., 90, 3022 (1986); P. G. Debenedetti, Homogeneous Nucleation in Supercritical Fluids", AIChE J., 36, 1289 (1990); J. W. Tom and P. G. Debenedetti, "Particle formation with Supercritical Fluids—A Review", J. Aerosol. Sci., 22, 555 (1991).

Other tested solvents and solvent mixtures resulted in similar quality, but were more complex to work with since their boiling points are significantly lower, which required cooling of the solution. The ease of handling makes propane the preferred solvent but the other supercritical solvents are considered alternatives to propane in cases where propane cannot be used, such as when a precursor that is soluble in propane cannot be found. Other fluids can be used to further reduce the supercritical temperature if desired.

The propane fuel/solvent system was used to perform deposition efficiency and deposition rate studies. Deposition efficiencies of 17% were demonstrated for the deposition of fully dense $SiO_2$. Deposition rates of 1 μm/min were obtained for dense $SiO_2$.

During developmental experiments, it was established that one heating method is the application of an electric current between the nozzle end, where the precursor solution is injected into the low pressure region, and the back of the restriction tube. This directly heated restrictive tube method allows for fast changes in atomization due to a short response time. The location of most intense heating can be shifted toward the tip by increasing the connection resistance between the tip and the electrical lead connected to the tip. Thin walled restriction tubes possess a larger resistance than thick walled tubes and decrease the response time. Other heating methods can be applied and several have been investigated, including but not limited to, remote resistive heating, pilot flame heating, inductive heating and laser heating. One of ordinary skill in the art could readily determine other suitable heating means for regulating the temperature at the outlet port of the atomizer.

Remote resistive heating uses a non-conducting restriction tube that is located inside an electrically heated tube. The non-conducting tube will fit tightly into the conductive tube. Application of an electric current to the conductive type heats that tube and energy is transferred into the inner, non-conductive restriction tube. This method requires larger heating currents compared to the directly-heated restrictive tube method and shows longer response times, which can be advantages under certain conditions since the increased response time results in a high degree of thermal stability. On the other hand, pilot flame and laser heating use the energy of the pilot flame or laser light, respectively, to heat the restriction tube. This can be done in a directly heated setup where the tip of the restriction tube is subjected to the pilot flame or laser light or in an indirectly heated configuration where the larger outer tube is heated. Because the amount of energy that needs to be transferred into the solution is quite large, the heated tube will, preferably, have a thicker wall than in the case of direct electrical heating or remote electrical heating. Subjecting an outer tube to the pilot flame or laser light allows the use of a thin walled restriction tube.

Figure 2:
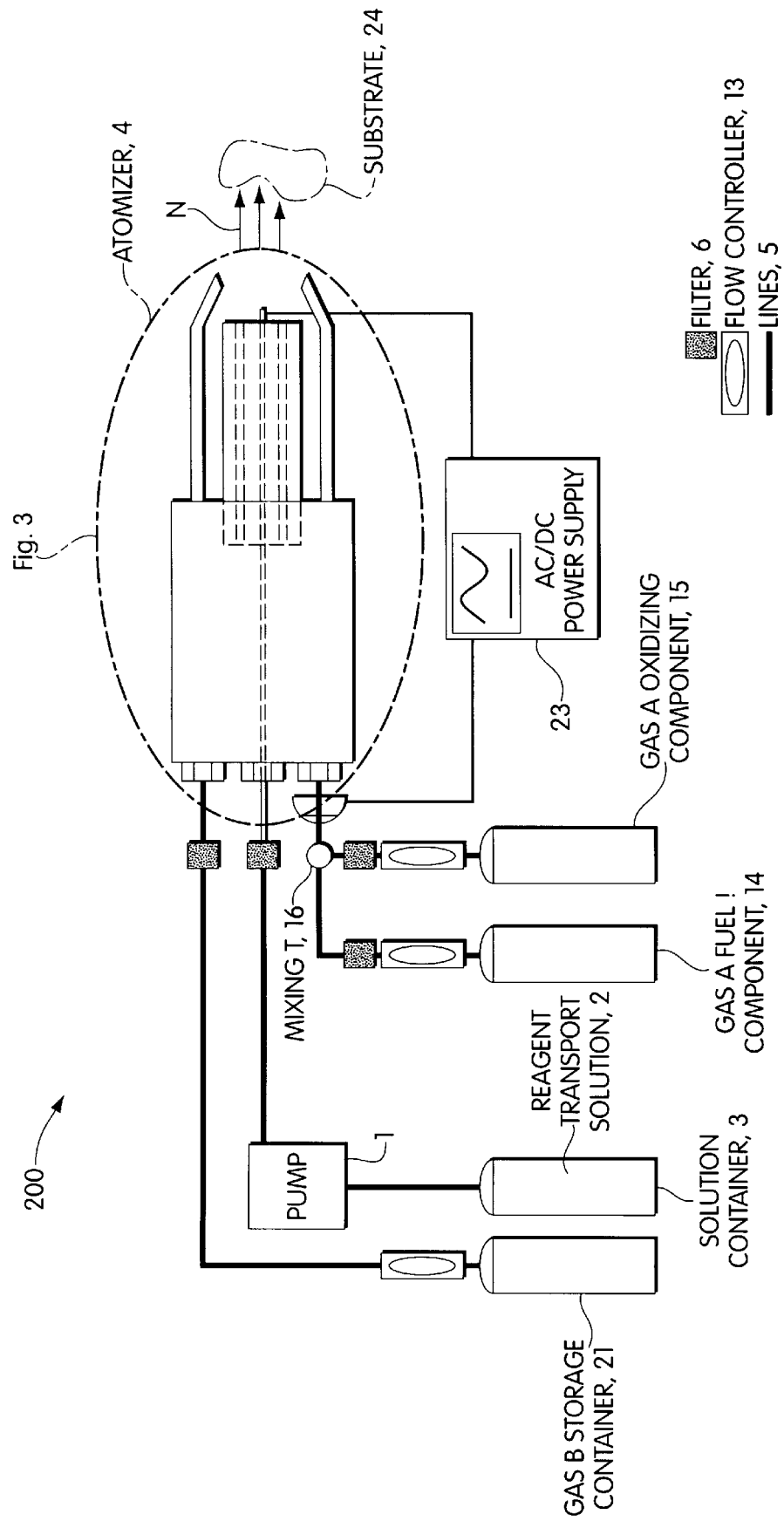
FIG. 2 shows a schematic diagram of an apparatus for the deposition of films and powders using near supercritical and supercritical atomization.
Figure 3:
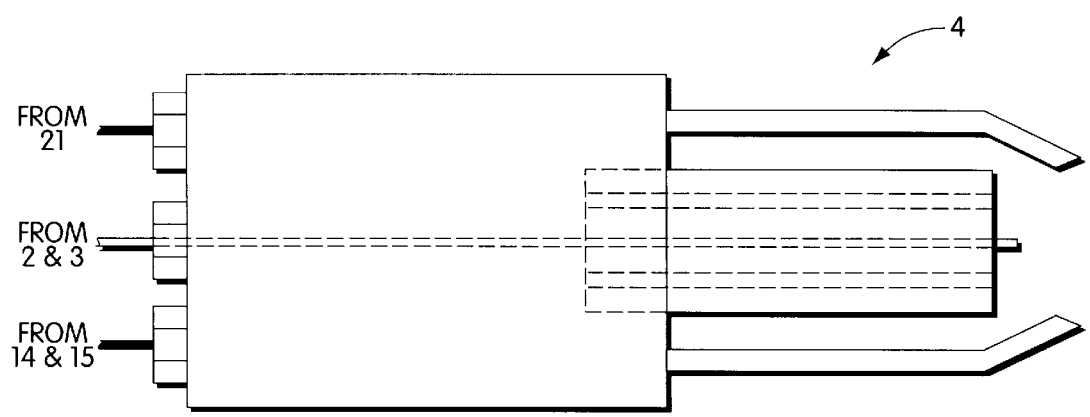
FIG. 3 shows a detailed schematic view of the atomizer used in the present invention.

Referring now to FIGS. 2 and 3, an apparatus 200 for the deposition of films and powders using supercritical atomization is shown. The apparatus 200 consists of a fixed or variable speed pump 1 that pumps the reagent transport solution 2 (also called "precursor solution") from the solution container 3 into the atomizer (also referred to as the "nebulizer" or "vaporizer") 4. FIG. 3 is an inset view showing a more detailed schematic view of the atomizer 4. The precursor solution 2 is pumped from the precursor solution container 3 through lines 5 and filters 6 and into the atomizer 4. The precursor solution 2 is then pumped into a constant or variable temperature controlled restrictor 7. Heating can be accomplished in many ways including, but not limited to, resistive electrical heating, laser heating, inductive heating, or flame heating. For resistive electrical heating, either AC or DC current can be used. One of the electrical connections 8 to the restrictor 7 is preferably placed very close to the tip of the restrictor 7. In the case of heating by a DC source, this connection 8 or pole can be either positive or negative. The other pole 9 can be connected at any other point along the restrictor 7, inside or outside the housing 10. For special applications such as coating the inside of tubes, where a small total atomizer size is advantageous, it is preferable to either connect to the restrictor 7 at the back of the housing 10 or to connect inside the housing 10. Gas connections at the back of the housing 10 are shown in an on-line arrangement but can be placed in any other arrangement that does not interfere with the function of the apparatus 200.

The thin gas A supply line 11, 1/16" ID in most cases, carries a combustible gas mix to a small outlet 12 where it can serve as a stable pilot flame, preferably within 2.5 cm of the restrictor 7, for the combustion of the precursor solutions supplied via the restrictor 7. Gas A supply is monitored by a flow controller 13, controlling the flow of the individual gas A mix components, 14 and 15. The gas A fuel component 14 is mixed with the oxidizing component 15 in a mixing "T" 16 close to or inside the atomizer 4. This late mixing is preferably for safety reasons because it reduces potential flash-back. Distributions channels inside the housing 10 connect the gas supply lines 11 to the gas A feed 17. Gas B supply lines 18 are used to deliver gas B from the supply 19 such that good mixing with the nebulized solutions spray can be accomplished. In most cases a high velocity gas stream is utilized. A number of gas B supply holes 20 (four for most cases, more or less holes can be used depending on the particular application) is placed around the restrictor 7 supplying gas B such that the desired flow patter is obtained. The flow properties of the gas B stream are influenced by such factors as gas B pressure in the gas B storage container 21, flow rate as determined by the flow controller 13, line diameters 5, and number of supply holes 20. Alternatively, gas B can be fed through a larger tube coaxial to and surrounding the restrictor 7. Once the precursor solution 2 has been pumped into the precursor supply 22 its temperature is controlled by the current flow (in the case of electrical heating) through the restrictor 7 as determined by the power supply 23. This heating current can then be adjusted such that the proper amount of atomization (nebulization, vaporization) can occur. The stable pilot flame is then capable of igniting the nebulized reactive spray and depositing a powder or film on a substrate 24.

Many different coatings have been deposited using the methods and apparatuses of the present invention. While propane was used in most cases as the super critical secondary solvent (i.e. a small amount of high precursor concentration primary solvent was mixed with a large amount of secondary solvent), others solvents have been used. Other possible secondary solvents include, but are not limited to, ethylene, ethane, and ammonia. The following is a list of materials deposited to date using the apparatus of FIG. 2 and only represents a few of the many possible materials which can be deposited using the present invention. This list is not intended to limit the scope of the present invention as set forth in the claims:

METALS: Ag, Au, Cu, Ni, Pt and Rh;

OXIDES: $Al_2O_3$, $3Al_2O_3$-$2SiO_2$, $BaCeO_3$, $BaTiO_3$, BST, $Cr_2O_3$, $Cu_2O$, DLC, $In_2O_3$, (K)-$SiO_2$, $LaPO_4$, LSC, LSM, MgO, MnO-Pt, NiO, $PbSO_4$, PdO, PLZT, PZT, $RuO_2$, $SiO_2$, $SnO_2$, $SrLaAlO_4$, $SrTiO_3$, $TiO_2$, $YBa2Cu_3O_x$, YIG, YSZ, YSZ-Alumina (ZTA), $Y_2O_3$ and $ZrO_2$;

OTHERS: $BaCO_3$, $LaPO_4$ and $PbSO_4$

One of ordinary skill in the art would recognize that almost any substrate can be coated by the method and apparatus of the present invention. A substrate can be coated if it can withstand the temperature and conditions of the resulting hot gases produced during the process. Substrates can be cooled using a means for cooling (described elsewhere herein), such as a water jet, but at low substrate surface temperatures, dense or crystalline coatings of many materials are not possible because of the associated low diffusion rates. In addition, substrate stability in the hot gases can be further accounted for by using a low temperature, low pressure flame, either with or without additional substrate cooling.

YSZ and Pt have been deposited as powders. Other materials can be deposited as a film or powder with this technology. Thus, it must be emphasized that the present invention is broad in applicability and that the materials and substrates encompassed by the present invention are not limited to the above-listed materials.

With this in mind, examples using the preferred embodiments of the above-described methods and apparatuses are set forth hereinbelow. Other features of the invention will become apparent from the following examples, which are for illustrative purposes only and are not intended as a limitation upon the present invention.

EXAMPLE I

To illustrate the coating deposition capability of the process of the present invention, simple oxide coatings were formed on a metal substrate. $SiO_2$ was deposited onto water cooled aluminum foil from a solution of tetraethoxysilane $[Si(OC_2H_5)_4]$ dissolved in isopropanol to 2.1 wt % Si, additional isopropanol (3.2 ml) and propane (51 ml) were added for an overall silicon concentration of 0.06 M. The gas temperature for deposition was 1190° C. The needle used to nebulize the precursor, as seen in FIG. 3, was 304 stainless steel with OD=0.012 inches and ID=0.004 inches. The resistance over the electrical flow length of the needle was about 1.6 W. Small pilot flames formed from combusted ethane and oxygen were used throughout the deposition to maintain the flame. The solution was pumped to the needle at 3 ml/min and nebulized by controlling the amount of current through the needle. In this example, the current was 2.65 A. The solution pressure from pumping during a deposition can vary from one run to another and is not important as long as a minimum pressure is maintained to ensure proper fluid properties. In this case, the resulting pressure was 500 psi. Oxygen flowed around the outside of the solution flame was measured through the flow meter at a pressure of 30 psi and a flow rate of 4750 ml/min.

The aluminum foil substrate was cooled during the deposition by a 80 psi generated air-water mist directed onto the substrate side opposite to the side upon which deposition occurred. The deposition rate for a coating applied at 1190° C. for 48 seconds was approximately 1 $\mu$m/min and the deposition efficiency was 16.6% (calculated by dividing the weight gain by the total available precursor material as reacted silica). The amorphous coating was dense and adherent on the substrate. Although the surface of the coating was not as smooth as that achieved at lower deposition rates, good thin film interference colors were observed. No substrate oxidation occurred.

EXAMPLE II

In addition to coatings formed on metal substrates, such as the oxide deposited on aluminum in Example I, coatings have also been formed on plastic substrates. Platinum was deposited onto Teflon at a gas temperature of 200 to 260° C. from a 0.005M solution of platinum-acetylacetonate $[Pt(CH_3COCHCOCH_3)_2]$, toluene and methanol. The deposition apparatus used was similar to that used for Example I, except two separate pilot lights were used and the oxygen was supplied via a coaxial tube surrounding the reagent solution. The solution flow rate was 2 ml/min with a pressure of 1500 psi and a needle current of approximately 3.3 A. The oxygen flowed at a pressure of 20 psi and a rate of 4750 ml/min. The resulting adherent film was smooth, dense and uniform. X-ray diffraction ("XRD") confirmed the formation of platinum with a (111) preferred growth direction.

This example also illustrates that the coatings produced by the process of the present invention are not exclusively oxides. Platinum was deposited as a pure element.

EXAMPLE III

The coatings developed by the present invention are not limited to formation on planar substrates. Films have been deposited on ceramic fiber tows using the apparatus of the present invention. $LaPO_4$ was deposited onto an alumina fiber tow from a solution of triethylphosphate $[(C_2H_5O)_3PO_4]$ dissolved in toluene to 1.7 wt % P, lanthanum 2-ethylhexanoate $[La(OOCCH(C_2H_5)C_4H_9)_3]$ dissolved in toluene to 1 wt % La, additional toluene (16 ml) and propane (273 ml). The resulting solution had concentrations of 0.0010M P and 0.0013M La. The solution flowed at a rate of 3 ml/min with a pressure of 410 psi during the deposition and was nebulized with a needle current of 2.36 A. The flow rate of oxygen to the solution flame was 4750 ml/min at a pressure of 30 psi.

The 400 fibers in the tow were coated at the same time. Each fiber was approximately 12 mm in diameter. The tow was slowly moved through the deposition zone of the flame two times. Only two passes through the flame (where the tow was rotated 180 degrees about its long axis for the second pass relative to the first pass) were needed to produce a uniform coating over individual fibers in the tow. The dense, columnar coatings produced at a 900° C. gas temperature ranged from 300 to 500 nm in thickness for more than 50% of the fibers in the tow. No excessive fiber degradation resulted from the flame exposure. XRD confirmed that the coating formed on the alumina fibers was monzanite, $LAPO_4$.

This example also illustrates that the oxide coatings produced by the CCVD process are not limited to binary oxides. The $LaPO_4$ included in this example was formed from a solution containing two cation-containing precursors added in a ratio to obtain a specific film stoichiometry. EDX compositional analysis showed that the atomic percent of each cation deposited was as desired at both 900 and 1000° C.

EXAMPLE IV

Example III illustrated the ability of the present invention to deposit coatings composed of more than one cation. Coatings from a solution with up to five different cation-providing precursors have also been deposited using an apparatus similar to that described in Example I. Nickel-, aluminum- and strontium-doped $LaCrO_3$ coatings were produced from a solution containing lanthanum nitrate $[La(NO_3)_3]$ dissolved in ethanol to 32.077 wt % La, chromium nitrate $[Cr(NO_3)_3]$ dissolved in ethanol to 13 wt % Cr, strontium nitrate $[Sr(NO_3)_2]$ dissolved in ethanol to 2 wt % Sr, nickel nitrate $[Ni(NO_3)_2]$ dissolved in ethanol to 2 wt % Ni, aluminum nitrate $[Al(NO_3)_3]$ dissolved in ethanol to 0.1 wt % Al, ethanol (12 ml), isopropanol (25 ml) and water (5 ml). The resultant solution had concentrations of 0.045M La, 0.040M Cr, 0.005M Sr, 0.005M Ni and 0.005M Al. The solution flowed at 2 ml/min with a pressure of 5200 psi, while oxygen flowed to the solution flame at a rate of 1600 ml/min and a pressure of 35 psi. The coatings were deposited at 1150 to 1250 ° C. for 16 minutes onto fused silica substrates. EDX analysis of a coating revealed cation ratios of approximately 1:26:5:5:63 for Al, Cr, Ni, Sr and La, respectively. The successful coating deposition from precursors such as the low vapor pressure nitrates illustrates that the present invention is not limited to deposition from metal organic reagents.

EXAMPLE V

The ability to coat different substrates by the process of the present invention was illustrated in the previous examples. Structural relationships of the deposited film with a substrate have also been demonstrated using a similar process as described in Example I. PLZT (Pb, La, Zr, Ti) was deposited onto single crystal (100) MgO from a solution containing Pb 2-ethylhexanoate [$Pb(OOCCH(C_2H_5)C_4H_9)_2$] dissolved in toluene to 4 wt % Pb, tris (2,2,6,6-tetramethyl -3,5-heptanedionato) lanthanum [$La(C_{11}H_{19}O_2)_3$] dissolved in toluene to 0.28 wt % La, Zr 2-ethylhexanoate [$Zr(OOCCH(C_2H_5)C_4H_9)_4$] dissolved in toluene to 6 wt % Zr, Ti (IV) i-propoxide $Ti[OCH(CH_3)_2]_4$ dissolved in toluene to 0.82 wt % Ti and all combined in toluene (95.8 ml). The resultant solution had concentrations of 0.0023M La, 0.0012M Zr, 0.0010M Pb and 0.0003M La. The solution flowed at a rate of 1.5 ml/min with a pressure of 2400 psi during the deposition, while oxygen flowed at a rate of 1600 ml/min and a pressure of 30 psi.

An XRD pole figure pattern of the (101) peak for PLZT deposited onto MgO at 700° C. for 16 minutes showed a high degree of epitaxy of the PLZT on the substrate. There were no intensities higher than 50 except at the four 44 degree Psi locations which were each at 90° Phi to each other. Other than 3 minor peaks which were 0.005% of the maximum, there were no additional peaks higher than 0.002% of the maximum. No additional epitaxial peaks were present with the PLZT.

EXAMPLE VI

Multilayer coatings have also been produced by the process of the invention using the apparatus described in Example I. A twenty-two layer coating of alternating Al5YSZ-16YSZ was produced from two different solutions. The YSZ was deposited from a solution of 0.51 g of Zr 2-ethylhexanoate [$Zr(OOCCH(C_2H_5)C_4H_9)_4$] dissolved in toluene to 6 wt % Zr and 0.80 g of Y 2-ethylhexanoate [$Y(OOCCH(C_2H_5)C_4H_9)_3$] dissolved in toluene to 0.69 wt % Y all combined in 150 ml of toluene. The resulting concentrations were 0.0022 M Zr and 0.0004 M Y. The YSZ-Al solution consisted of the two precursors listed above at 0.38 g and 0.18 g respectively and 0.08 g of aluminum acetylacetonate [$Al(CH_3COCHCOCH_3)_3$] dissolved in toluene to 0.1 wt % Al and combined in 150 ml of toluene.

The coating was produced from a single flame, where the solution fed to the flame was alternated every 3 minutes with a line-cleansing flow of toluene between each solution for one minute. The solution flow rate was kept constant at 3 ml/min for both solutions and the current through the needle was consistently 3.3 A. The solution pressure was 1700 to 2000 psi. The oxygen fed to the flame flowed at a rate of 4750 ml/min and a pressure of 20 psi. The coating deposition took 90 minutes and was performed at gas temperature of 1100 to 1150° C. The resultant multilayer coating was smooth, dense and 1 mm thick with no observed cracking. Each layer was approximately 40 nm thick.

EXAMPLE VII

The CCVD process also allows the production of powder. The ease in which powder can be created was demonstrated by the formation of YSZ powder on the first attempt to deposit that material as a powder. The solution used consisted of Zr 2-ethylhexanoate dissolved in toluene to 6 wt %, Y 2-ethylhexanoate dissolved in toluene to 0.69 wt %, toluene (6.9 ml) and propane (136.7 ml). The concentrations of the zirconium and yttrium were 0.005M and 0.0003M, respectively. The current through the needle during the deposition was 2.66 A. The temperature at which the powder deposition occurred was 700° C. and the time of deposition was 32 minutes. The powder was deposited onto an aluminum foil container that was filled with ice water. The water helped to cool the deposition surface to a temperature much cooler than that of the flame. The surface was warm enough, though, that there was no formation of excessive moisture condensation on the deposition area.

Once the deposition was complete, some of the powder that collected on the container was scraped off the foil and analyzed by transmission electron microscopy (TEM). Individual formed powder grains could be differentiated from the large clusters of substrate grains that resulted from the scraping process. EDX was used to confirm the presence of Zr and Y. The powder grain size ranged from approximately 2 to 10 nm with most of the grains being 4 to 6 nm. In addition, the electron diffraction patterns obtained from the film were in the form of ring patterns, indicating that the powder was crystalline. The rings of the patterns were smooth and continuous as expected due to the small grain size. The d-spacings for the material were calculated from the rings, and the values matched the d-spacings expected for YSZ. However, because of the limited number of rings available for indexing and the similarity between d-spacing values for different types of zirconia with or without yttria, the specific structure (hexagonal, tetragonal, etc.) of the powder could not be determined from electron diffraction. X-ray diffraction of the plane powder yielded similar results, although a close match was made with an yttrium stabilized zirconium oxide.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A powder produced by a process comprising:

a) at a first selected temperature and a first selected pressure, dissolving into a suitable carrier to form thereby a transport solution one or more reagents capable of reacting to form a powder in a region, wherein the region has a second selected pressure lower than the first selected pressure;

b) pressurizing the transport solution to a third selected pressure above the second selected pressure using a pressure regulator;

c) directing the pressurized transport solution to a fluid conduit having an input end and an opposed output end having a temperature regulator positioned thereon for regulating the temperature of the solution at the output end, wherein the output end further comprises an outlet port oriented to direct the fluid in the conduit into the region;

d) heating the solution to a second selected temperature near the critical temperature of the solution while maintaining the third selected pressure above the second selected pressure and above the corresponding critical pressure of the solution at the second selected temperature;

e) directing the pressurized, heated solution through the outlet port of the conduit into the region to produce a spray;

f) admixing one or more selected gases into the spray to form a reactable spray; and g) exposing the reactable spray to an energy source to react the reactable spray, thereby forming the powder.

* * * * *

UNITED STATES PATENT AND TRADEMARK OFFICE
CERTIFICATE OF CORRECTION

PATENT NO. : 6,132,653
DATED : October 17, 2000
INVENTOR(S) : Hunt et al.

Page 1 of 1

It is certified that error appears in the above-identified patent and that said Letters Patent is hereby corrected as shown below:

Column 1,
Line 5, before "BACKGROUND OF THE INVENTION" the following paragraph should be inserted:
-- This invention was made with US Government support under contract N00014-97-C-0265 awarded by the Office of Naval Research. The US Government has certain non-transferable rights in the invention. --.

Signed and Sealed this

Thirteenth Day of September, 2005

JON W. DUDAS
*Director of the United States Patent and Trademark Office*